(12) United States Patent
Jonker et al.

(10) Patent No.: US 6,252,262 B1
(45) Date of Patent: Jun. 26, 2001

(54) METAL PASSIVATING LAYER FOR III-V SEMICONDUCTORS, AND IMPROVED GATE CONTACT FOR III-V-BASED METAL-INSULATOR-SEMICONDUCTOR (MIS) DEVICES

(75) Inventors: B. T. Jonker, Davidsonville, MD (US); O. J. Glembocki, Vienna; R. T. Holm, Alexandria, both of VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/210,596

(22) Filed: Dec. 15, 1998

(51) Int. Cl.⁷ .............. H01L 21/336; H01L 21/3205; H01L 21/4763
(52) U.S. Cl. .............. 257/192; 257/22; 257/183; 257/629; 257/631
(58) Field of Search .................. 257/192, 183, 257/629, 631, 22

(56) References Cited

U.S. PATENT DOCUMENTS 4,828,935 * 5/1989 Jonker et al. .

OTHER PUBLICATIONS

B.T. Jonker et al., "Enhanced Carrier Lifetimes and Suppression of Midgap States in GaAs at a Magnetic Metal Interface", Phys. Rev. Lett. 79(24) 4886–89 (Dec. 15, 1997).

M. Passlack et al., "Low $D_{it}$, Thermodynamically Stable $Ga_2O_3$–GaAs Interfaces: Fabrication, Characterization, and Modeling", IEEE Trans. Electr. Dev. 44(2) 214–25 (Feb. 1997).

M. Passlack et al., "GaAs surface passivation using in–situ oxide deposition", Appl. Surf. Sci 104/105 441–47 (1996).

* cited by examiner

*Primary Examiner*—Kevin M. Picardat
*Assistant Examiner*—D. M. Collins
(74) *Attorney, Agent, or Firm*—John J. Karasek; Jane B. Marciniszyn

(57) ABSTRACT

A passivating layer is provided for a III–V semiconductor. The passivating layer is preferably made of Fe and is used with III–V (especially GaAs) devices. At least one full monolayer of the passivating layer is formed, so that one full monolayer of the passivating layer bonds with one full monolayer of the atomic species of the semiconductor.

22 Claims, No Drawings

METAL PASSIVATING LAYER FOR III-V SEMICONDUCTORS, AND IMPROVED GATE CONTACT FOR III-V-BASED METAL-INSULATOR-SEMICONDUCTOR (MIS) DEVICES

BACKGROUND OF THE INVENTION

1. Field of the Invention

The present invention relates to passivating layers for III–V semiconductors.

2. Related Art

Gallium arsenide semiconductors, as well as other III–V semiconductors, have become increasingly popular because of their extremely high speeds of operation and high operating frequencies. However, many III–V materials, including GaAs, are sensitive to surface effects. Mid-gap states are created near the surface of the material which result in high surface recombination velocities for free carriers, an accompanying decrease in carrier lifetimes, and Fermi level pinning. In GaAs devices, it is believed that midgap states are created by As atoms near the surface/interface which have dangling bonds or occupy positions in the lattice which should be occupied by Ga atoms.

Much effort has been made to develop procedures which effectively passivates the exposed surfaces of III–V materials, most notably GaAs. A variety of surface treatments have been attempted with limited Success. These include wet chemical application of a sulphur surface layer (see C. J. Sandroff et al., Appl. Phys. Lett. 50,256 (1987); and J. F. Fan, H. Oigawa and Y. Nannichi, Jpn. J. Appl. Phys. 27, L1331 (1988) or a selenium surface layer (see C. J. Sandroff et al., J. Appl. Phys. 67, 586 (1990), and S. Belkouch et al., Solid State Elect. 39,507 (1996)) or in-situ growth of a selected oxide (see M. Passlack et al., Appl. Surf. Sci. 104/105, 441 (1996)) to inhibit the formation of surface mid-gap states. A number of patents relate to passivating layers for GaAs semiconductors including, for example, U.S. Pat. Nos. 4,546,372 (Shuskus), 5,550,089 (Dutta et al.), 5,539,248 (Abrokwah et al.) and 5,686,756 (Hori). One particular passivating layer for III–V semiconductor materials of interest here is that disclosed in U.S. Pat. No. 4,828,935 (Jonker et al), the disclosure of which is hereby incorporated by reference. The passivating layer is formed of Zn and Se as the active components and the patent is of interest because of the disclosure therein states that the passivating layer may include a quantity of Fe. However, the Fe is not an active component, but is rather used to widen the bandgap of the material, and the passivating layer has structural defects which are disadvantageous.

Si CMOS (complementary metal-oxide-semiconductor) technology currently dominates the low power and digital industries due to its low power attributes. The existence of a stable native oxide, SiO2, which provides an insulating surface layer with minimal effect on the properties of the underlying Si, has been the key enabling ingredient. There is great interest in utilizing GaAs (and related compounds, e.g. AlGaAs, InGaAs) for such applications rather than Si, since they offer both higher speed and lower power operation. However, in contrast to Si, there is no stable native oxide for GaAs currently available. The oxide which forms on the GaAs surface is unstable, and produces a high density of defect states at the GaAs/oxide interface, which significantly degrade performance. These states at the GaAs surface/interface act as scattering and/or trapping centers, limit carrier lifetimes, and pin the Fermi energy at midgap. These states are believed to be due to As which is released upon the formation of a Ga-related surface oxide and trapped near the interface. The lack of a stable insulating surface layer and the strong propensity for the formation of midgap interface states have been the key issues in preventing the implementation of GaAs-based metal oxide semiconductor field effect transistor (MOSFET) or metal insulator semiconductor (MIS) devices. A GaAs MOSFET/MISFET remains the grail of GaAs electronics.

Several efforts have focused on obtaining MOS-type operation in GaAs by substituting a wider bandgap material such as AlGaAs for the oxide as the insulating gate layer, with some success. This requires a more complex heterostructure, with additional disadvantages in that AlGaAs is a semiconductor, not an insulator, and the high Al concentrations required (75%) produce new defect states in the material; these factors result in finite leakage current and limit the allowed gate voltage swing.

SUMMARY OF THE INVENTION

Accordingly, an object of the invention is a passivating layer for passivating the surfaces of III–V semiconductor materials. The passivating layer suppresses the density of midgap states localized near the surface of the III–V material and, as a result, reduces the recombination velocities for free carriers and prevents Fermi level pinning.

Another object of the invention is a stable insulating surface layer for III–V semiconductor materials, to allow e.g., fabrication of improved GaAs-based MIS devices.

In one aspect, the invention is a metal passivating layer, at least a full monolayer thick, on a III–V semiconductor material, where the metal in the metal passivating layer bonds with the atomic species in the semiconductor material at the interface to prevent the formation of Group V dangling bonds and/or antisite defects (e.g., As on a Ga lattice site or Ga on an As lattice site). The passivating layer preferably prevents oxygen from reacting with the atomic species in the semiconductor material. Preferred metals for the passivating layer include iron (Fe), gold (Au), manganese (Mn), and combinations thereof. Preferably, the metal has a base of at least one of these metals (at least 51 at % is one or more of these metals).

The III–V semiconductor material is preferably selected from the group consisting of Group III—arsenic compounds and Group III—arsenic phosphide compounds.

In one preferred implementation, the metal film is patterned laterally to provide a lateral modulation potential. For instance, the metal film may be patterned into an array of wires or dots.

Another aspect of the invention includes a metal passivating layer for III–V semiconductor material, where this metal is at least partially oxidized. The oxide may form an insulator for an MIS device. Alternatively, the metal layer may be covered with any of the insulating layers used in device fabrication, e.g., silicon oxide, silicon dioxide, or silicon nitride.

Other features and advantages of the invention will be set forth in, or apparent from, the following detailed description of the preferred embodiments of the invention.

DESCRIPTION OF THE PREFERRED EMBODIMENTS

As described above, in general, according to the invention, passivating films are provided for III–V semiconductors which suppress the density of midgap states, increase carrier lifetimes near the surface and increase the frequency response of the semiconductor material. In one preferred embodiment of the invention, a film of Fe is used as a passivating layer for GaAs semiconductor material. Without wishing to be bound by a particular model, the inventors propose that Fe (or other metal) bonds with a full monolayer of As at the GaAs surface and that the Fe bonds at the surface of the semiconductor material satisfy the As dangling bonds and displace excess As at the interface. The reduction of excess As at the interface reduces the number of midgap states and improves the performance of the semiconductor. Good results have been achieved with Fe and Au. Good results should likewise be achieved with manganese (Mn), as well as with combinations of any two of these metals, or with combinations of all three metals, or with combinations of these metals and other metals. Such combinations of metals include, but are not limited to, alloys of these metals.

In one embodiment, Fe is deposited on the GaAs material before the GaAs material is removed from an ultra-high vacuum growth system. However, this method may be inconvenient and one alternative preferred method of depositing the Fe film involves first displacing the GaAs native oxide with sulfur, selenium or some other material. Suitable procedures and materials for displacing the GaAs native oxide are known in the art. In an exemplary procedure $HCl/H_2O$ is first used to strip the oxide. The material is then soaked in $(NH_4)_2S$ for 25 minutes at 65° C. The material is finally rinsed with deionized water (DI) and blown dry with $N_2$. The original native oxide is replaced with a thin layer of S. The S layer is then thermally desorbed from the GaAs surface in an ultra-high vacuum chamber and the Fe passivating layer is deposited from an Fe evaporation source.

In another preferred deposition method, the GaAs material is dipped into a solution containing dissolved Fe. The solution must remove the native oxide and replace it with a layer of Fe. In one particularly preferred method, the solution contains FeS powder dissolved into either $(NH_4)_2S$ or a solution of hydrochloric acid. In an alternative preferred method, the GaAs native oxide is first displaced with sulfur, selenium or some other material before dipping the GaAs material into the solution containing dissolved Fe.

A portion of the Fe film may be etched away for lateral control of the position of the Fermi energy ($E_f$). When a portion of the Fe film is etched away and the exposed portion of the GaAs material oxidizes, $E_f$ is pinned under the oxide surface at about 0.7 eV below the conduction band minimum, due to the high density of midgap states. $E_f$ is not pinned in the region under the passivating layer and is about 0.9 eV below the conduction band minimum with no bias applied, due to the Schottky barrier formed. A laterally patterned Fe passivating film will therefore produce a corresponding lateral variation in potential in the GaAs material due to the difference in Fermi level position between the passivating film covered portions and the oxide film covered portions, with a potential variation of 0.9−0.7=0.2 eV. Further changes in the potential variation can be obtained by applying a dc bias to the passivating film covered regions, since the Fermi level is not pinned in the passivating film covered regions. When the passivating film is patterned in the shape of an array of wires, with no bias applied, a type II lateral superlattice is formed, spatially separating the electrons and holes and turning off properties proportional to the electron-hole wavefunction integral, such as optical absorption. When the passivating film covered regions are forward biased, a flat band condition is obtained and optical absorption is turned on. Patterning the passivating film can also be used to fabricate resonant tunneling diode structures which are tunable.

Although the foregoing description has focused on Fe, the invention is not limited to the use of Fe as the passivating film. For example, in an alternative preferred embodiments, alloys of Fe or gold are used. In general, the composition of the alloys is chosen such that it is the Fe or gold which bonds with As and not some other constituent of the composition. Similarly, pure Fe is not required as long as it is Fe which bonds with the As. In general, the material used for the passivating film should prevent ambient $O_2$ from reacting with the GaAs surface, while allowing excess As to diffuse through and away from the semiconductor interface.

Preferred semiconductor materials are: GaAs, Group III—arsenic compounds, and Group III—arsenic phosphide compounds.

Another aspect of the present invention entails the use of the Fe/GaAs(001) interface as the key ingredient and basis for the gate structure of an MIS device such as a MISFET. The Fe film is in direct contact with the GaAs (or related material e.g. AlGaAs), and establishes the desirable interface properties. This Fe film can be very thin, since interface properties are known to saturate at coverages on the order of 1 ML. We have deposited the Fe by molecular beam epitaxy (MBE) techniques in vacuum on the clean GaAs surface.

The Fe film may be epitaxially deposited to a specified thickness, and then simply allowed to oxidize upon exposure to atmosphere or controlled exposure to oxygen. This converts the metallic Fe film to $Fe_2O_3$, which is highly insulating, thermally stable, and is the iron oxide most likely to form upon exposure to oxygen. Since oxygen is far more likely to bond with Fe than either Ga or As, there is little probability for disruption of the GaAs and accompanying liberation of As near the interface. Ideally, all of the metallic Fe should be converted to an oxide, although it may be necessary to retain a very thin metallic layer at the GaAs interface to insure that the midgap states are suppressed. It may be necessary to increase the total thickness of this insulating layer by repeated Fe deposition/oxidation. Alternatively, the desired insulator thickness may be achieved by depositing another material on the Fe/ $Fe_2O_3$ layer, such as $SiO_2$, $Al_2O_3$, or silicon nitride.

Demonstration work was performed on samples grown by molecular beam epitaxy, where the Fe film was deposited on the GaAs surface before it was exposed to atmosphere. The measurements of carrier lifetimes, density of midgap states, and frequency response were obtained ex situ using photoreflectace spectroscopy, and the absence of Fermi level pinning was demonstrated using dc-bias dependent electroreflectance spectroscopy. The Fe films studied to date were typically 50 Å thick. It is expected that much thinner Fe films can be used. A more complete account may be found in Jonker et al., Physical Review Letters 79 (24) 4886–89 (Dec. 15, 1997), incorporated by reference herein, in its entirety, for all purposes.

Although the invention has been described in detail with respect to preferred embodiments thereof, it will be apparent to those skilled in the art that variations and modifications can be effected in these embodiments without departing from the spirit and scope of the invention.

What is claimed is:

1. A passivating layer for a III–V semiconductor material comprising a metal film at least one monolayer thick which bonds with the atomic constituents of said semiconductor material to prevent the formation of Group V dangling bonds and antisite defects at the interface between said passivating layer and said semiconductor material.

2. A passivating layer as claimed in claim 1, wherein said film prevents oxidation of said semiconductor material at said interface.

3. A passivating layer as claimed in claim 1, wherein said metal film is a laterally patterned metal film for providing lateral modulation of potential in said semiconductor material.

4. A passivating layer as claimed in claim l, wherein said film has a base of Fe, Au, Mn, or combinations thereof.

5. A passivating layer as claimed in claim 4, wherein said film is an Fe base film.

6. A passivating layer as claimed in claim 4, wherein said film has a base of an alloy of at least two of the group Fe, Au, and Mn.

7. A passivating layer as claimed in claim 4, wherein said film consists essentially of Fe, Au, Mn, or combinations thereof.

8. A passivating layer as claimed in claim 4, wherein said film consists essentially of Fe.

9. A passivating layer as claimed in claim 1, wherein said metal film is partially oxidized, wherein at least a full monolayer of said metal film at said interface with said semiconductor is unoxidized.

10. A passivating layer as claimed in claim 1, wherein said metal film is coated with an insulating layer for use in semiconductor devices.

11. A passivating layer as claimed in claim 9, wherein said at least partially oxidized metal film is coated with an insulating layer for use in semiconductor devices.

12. A passivating layer as claimed in claim 1, wherein said III–V semiconductor is selected from the group consisting of Group III—arsenic compounds and Group III—arsenic phosphide compounds.

13. A passivating layer as claimed in claim 12, wherein said film has a base of Fe, Au, Mn, or combinations thereof.

14. A passivating layer as claimed in claim 12, wherein said metal film is a laterally patterned metal film for providing lateral modulation of potential in said semiconductor material.

15. A passivating layer as claimed in claim 12, wherein said at least partially oxidized metal film is coated with an insulating layer for use in semiconductor devices.

16. A passivating layer as claimed in claim 12, wherein said semiconductor material is a Group III—arsenic compound.

17. A passivating layer as claimed in claim 16, wherein said film has a base of Fe, Au, Mn, or combinations thereof.

18. A passivating layer as claimed in claim 17, wherein said metal film is a laterally patterned metal film for providing lateral modulation of potential in said semiconductor material.

19. A passivating layer as claimed in claim 17, wherein said metal film is partially oxidized, wherein at least a full monolayer of said metal film at said interface with said semiconductor is unoxidized.

20. A passivating layer as claimed in claim 17, wherein said metal film is coated with an insulating layer for use in semiconductor devices.

21. A passivating layer as claimed in claim 17, wherein said at least partially oxidized metal film is coated with an insulating layer for use in semiconductor devices.

22. A passivating layer as claimed in claim 17, wherein said film is an Fe base film.

* * * * *